United States Patent
Zhang et al.

(10) Patent No.: US 10,410,832 B2
(45) Date of Patent: Sep. 10, 2019

(54) CONTROL OF ON-WAFER CD UNIFORMITY WITH MOVABLE EDGE RING AND GAS INJECTION ADJUSTMENT

(71) Applicant: Lam Research Corporation, Fremont, CA (US)

(72) Inventors: Yiting Zhang, Fremont, CA (US); Saravanapriyan Sriraman, Fremont, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/241,393

(22) Filed: Aug. 19, 2016

(65) Prior Publication Data

US 2018/0053629 A1    Feb. 22, 2018

(51) Int. Cl.
*H01J 37/32*     (2006.01)

(52) U.S. Cl.
CPC .... *H01J 37/32082* (2013.01); *H01J 37/3244* (2013.01); *H01J 37/3299* (2013.01); *H01J 37/32715* (2013.01); *H01J 2237/334* (2013.01)

(58) Field of Classification Search
CPC ............ H01J 37/32642; H01J 37/3244; H01L 21/6831–6833; H01L 21/68735
USPC ........................................ 156/345.24–345.26
See application file for complete search history.

(56) References Cited

U.S. PATENT DOCUMENTS

| | | |
|---|---|---|
| 4,374,698 A | 2/1983 | Sanders et al. |
| 4,431,477 A | 2/1984 | Zajac |
| 4,793,897 A | 12/1988 | Dunfield et al. |
| 5,329,965 A | 7/1994 | Gordon |
| 5,605,179 A | 2/1997 | Strong, Jr. et al. |
| 5,660,673 A | 8/1997 | Miyoshi |

(Continued)

FOREIGN PATENT DOCUMENTS

| | | |
|---|---|---|
| CN | 102243977 A | 11/2011 |
| CN | 102315150 A | 1/2012 |

(Continued)

OTHER PUBLICATIONS

MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.

(Continued)

*Primary Examiner* — Charlee J C Bennett

(57) ABSTRACT

A substrate support in a substrate processing system includes an inner portion and an outer portion. The inner portion is positioned below a gas distribution device configured to direct first process gases toward the inner portion. The outer portion includes an edge ring positioned around an outer perimeter of the inner portion to at least partially surround the inner portion and a substrate arranged on the inner portion. The edge ring is configured to be raised and lowered relative to the inner portion, and to direct second process gases toward the inner portion. A controller determines distribution of material deposited on the substrate during processing and, based on the determined distribution, selectively adjusts a position of the edge ring and selectively adjusts flow of at least one of the first process gases and the second process gases.

12 Claims, 7 Drawing Sheets

(56) References Cited

U.S. PATENT DOCUMENTS

| | | | |
|---|---|---|---|
| 5,662,143 A | 9/1997 | Caughran | |
| 5,744,695 A | 4/1998 | Forbes | |
| 5,762,714 A | 6/1998 | Mohn et al. | |
| 6,022,809 A | 2/2000 | Fan | |
| 6,042,687 A | 3/2000 | Singh et al. | |
| 6,044,534 A | 4/2000 | Seo et al. | |
| 6,060,400 A | 5/2000 | Oehrlein et al. | |
| 6,074,959 A | 6/2000 | Wang et al. | |
| 6,152,168 A | 11/2000 | Ohmi et al. | |
| 6,206,976 B1 | 3/2001 | Crevasse et al. | |
| 6,210,593 B1 * | 4/2001 | Ohkuni | G01L 9/0042 216/2 |
| 6,376,386 B1 | 4/2002 | Oshima | |
| 6,589,352 B1 | 7/2003 | Yudovsky et al. | |
| 6,744,212 B2 | 6/2004 | Fischer et al. | |
| 6,841,943 B2 | 1/2005 | Vahedi et al. | |
| 6,896,765 B2 | 5/2005 | Steger | |
| 6,898,558 B2 | 5/2005 | Klekotka | |
| 6,962,879 B2 | 11/2005 | Zhu et al. | |
| 7,129,171 B2 | 10/2006 | Zhu et al. | |
| 7,288,482 B2 | 10/2007 | Panda et al. | |
| 7,309,646 B1 | 12/2007 | Heo et al. | |
| 7,338,907 B2 | 3/2008 | Li et al. | |
| 7,757,541 B1 | 7/2010 | Monkowski et al. | |
| 7,758,698 B2 | 7/2010 | Bang et al. | |
| 7,968,469 B2 | 6/2011 | Collins et al. | |
| 8,137,463 B2 | 3/2012 | Liu et al. | |
| 8,552,334 B2 | 10/2013 | Tappan et al. | |
| 8,555,920 B2 | 10/2013 | Hirata et al. | |
| 8,592,328 B2 | 11/2013 | Hausmann et al. | |
| 8,889,024 B2 | 11/2014 | Watanabe et al. | |
| 8,956,980 B1 | 2/2015 | Chen et al. | |
| 8,999,106 B2 | 4/2015 | Liu et al. | |
| 9,011,637 B2 | 4/2015 | Yamamoto | |
| 9,051,647 B2 | 6/2015 | Cooperberg et al. | |
| 9,059,678 B2 | 6/2015 | Long et al. | |
| 9,142,391 B2 | 9/2015 | Yamamoto | |
| 9,318,343 B2 | 4/2016 | Ranjan et al. | |
| 9,471,065 B2 | 10/2016 | Koyomogi et al. | |
| 9,640,409 B1 | 5/2017 | Yang et al. | |
| 2001/0002581 A1 | 6/2001 | Nishikawa et al. | |
| 2001/0004903 A1 | 6/2001 | Ohmi et al. | |
| 2001/0013363 A1 | 8/2001 | Kitayama et al. | |
| 2002/0038669 A1 | 4/2002 | Yamagishi et al. | |
| 2002/0042205 A1 | 4/2002 | McMillin et al. | |
| 2002/0045265 A1 | 4/2002 | Bergh et al. | |
| 2002/0046991 A1 | 4/2002 | Smith et al. | |
| 2002/0048536 A1 | 4/2002 | Bergh et al. | |
| 2002/0072240 A1 | 6/2002 | Koike | |
| 2002/0160125 A1 | 10/2002 | Johnson et al. | |
| 2002/0174905 A1 | 11/2002 | Latino et al. | |
| 2002/0175144 A1 | 11/2002 | Hung et al. | |
| 2003/0201069 A1 | 10/2003 | Johnson | |
| 2003/0236592 A1 | 12/2003 | Shajii et al. | |
| 2003/0236638 A1 | 12/2003 | Shajii et al. | |
| 2003/0236643 A1 | 12/2003 | Shajii et al. | |
| 2004/0053428 A1 | 3/2004 | Steger | |
| 2004/0094206 A1 | 5/2004 | Ishida | |
| 2004/0112538 A1 | 6/2004 | Larson et al. | |
| 2004/0112539 A1 | 6/2004 | Larson et al. | |
| 2004/0112540 A1 | 6/2004 | Larson et al. | |
| 2004/0149389 A1 | 8/2004 | Fink | |
| 2004/0163601 A1 * | 8/2004 | Kadotani | H01J 37/32724 118/728 |
| 2004/0168719 A1 | 9/2004 | Nambu | |
| 2004/0173270 A1 | 9/2004 | Harris et al. | |
| 2004/0200529 A1 | 10/2004 | Lull et al. | |
| 2005/0005994 A1 | 1/2005 | Sugiyama et al. | |
| 2005/0067021 A1 | 3/2005 | Bevers et al. | |
| 2005/0155625 A1 | 7/2005 | Jangjian et al. | |
| 2005/0199342 A1 | 9/2005 | Shajii et al. | |
| 2005/0241763 A1 | 11/2005 | Huang et al. | |
| 2006/0011237 A1 | 1/2006 | Tison et al. | |
| 2006/0097644 A1 | 5/2006 | Kono et al. | |
| 2006/0124169 A1 | 6/2006 | Mizusawa et al. | |
| 2006/0207595 A1 | 9/2006 | Ohmi et al. | |
| 2006/0237063 A1 | 10/2006 | Ding et al. | |
| 2007/0026684 A1 | 2/2007 | Parascandola et al. | |
| 2007/0066038 A1 | 3/2007 | Sadjadi et al. | |
| 2007/0158025 A1 | 7/2007 | Larson | |
| 2007/0175391 A1 | 8/2007 | Mizusawa | |
| 2007/0233412 A1 | 10/2007 | Gotoh et al. | |
| 2007/0240778 A1 | 10/2007 | L'Bassi et al. | |
| 2007/0259112 A1 | 11/2007 | Ishikawa et al. | |
| 2008/0115834 A1 | 5/2008 | Geoffrion et al. | |
| 2008/0121178 A1 | 5/2008 | Bang et al. | |
| 2008/0202588 A1 | 8/2008 | Gold et al. | |
| 2008/0202609 A1 | 8/2008 | Gold et al. | |
| 2008/0202610 A1 | 8/2008 | Gold et al. | |
| 2008/0223873 A1 * | 9/2008 | Chen | H01J 37/3244 156/345.34 |
| 2008/0236749 A1 | 10/2008 | Koshimizu et al. | |
| 2009/0056629 A1 * | 3/2009 | Katz | H01J 37/3244 118/723 R |
| 2009/0061083 A1 | 3/2009 | Chiang et al. | |
| 2009/0061640 A1 | 3/2009 | Wong et al. | |
| 2009/0061644 A1 | 3/2009 | Chiang et al. | |
| 2009/0067954 A1 | 3/2009 | Lanee et al. | |
| 2009/0095364 A1 | 4/2009 | Itoh et al. | |
| 2009/0183548 A1 | 7/2009 | Monkowski et al. | |
| 2009/0183549 A1 | 7/2009 | Monkowski et al. | |
| 2009/0197423 A1 | 8/2009 | Koshimizu et al. | |
| 2009/0221117 A1 | 9/2009 | Tan et al. | |
| 2009/0272717 A1 | 11/2009 | Pamarthy et al. | |
| 2009/0320754 A1 | 12/2009 | Oya et al. | |
| 2010/0012310 A1 | 1/2010 | Christensen et al. | |
| 2010/0025369 A1 | 2/2010 | Negishi et al. | |
| 2010/0030390 A1 | 2/2010 | Yamaguchi et al. | |
| 2010/0071438 A1 | 3/2010 | Davis et al. | |
| 2010/0144539 A1 | 6/2010 | Bergh et al. | |
| 2010/0145633 A1 | 6/2010 | Yasuda | |
| 2010/0178770 A1 | 7/2010 | Zin | |
| 2010/0229976 A1 | 9/2010 | Hirata et al. | |
| 2010/0264117 A1 | 10/2010 | Ohmi et al. | |
| 2010/0269924 A1 | 10/2010 | Yasuda | |
| 2011/0019332 A1 | 1/2011 | Chistyakov | |
| 2011/0031111 A1 | 2/2011 | Kobayashi | |
| 2011/0094596 A1 | 4/2011 | Sugiyama et al. | |
| 2011/0135821 A1 | 6/2011 | Ding | |
| 2011/0253225 A1 | 10/2011 | Beeby et al. | |
| 2011/0265883 A1 | 11/2011 | Cruse et al. | |
| 2011/0287631 A1 * | 11/2011 | Yamamoto | H01J 37/32568 438/710 |
| 2011/0303696 A1 | 12/2011 | Kelekar et al. | |
| 2012/0031500 A1 | 2/2012 | Hirose et al. | |
| 2012/0034786 A1 | 2/2012 | Dhindsa et al. | |
| 2012/0097266 A1 | 4/2012 | Cobb et al. | |
| 2012/0149213 A1 | 6/2012 | Nittala et al. | |
| 2012/0152364 A1 | 6/2012 | Hashimoto et al. | |
| 2012/0174990 A1 | 7/2012 | Yasuda | |
| 2012/0190208 A1 | 7/2012 | Ozu et al. | |
| 2012/0238102 A1 | 9/2012 | Zhang et al. | |
| 2012/0238103 A1 | 9/2012 | Zhang et al. | |
| 2012/0244715 A1 | 9/2012 | Lebouitz et al. | |
| 2012/0289057 A1 | 11/2012 | DeDontney | |
| 2012/0298221 A1 | 11/2012 | Takeuchi et al. | |
| 2012/0305184 A1 | 12/2012 | Singh et al. | |
| 2012/0328780 A1 | 12/2012 | Yamagishi | |
| 2013/0008607 A1 | 1/2013 | Matsumoto et al. | |
| 2013/0025715 A1 | 1/2013 | Yamaguchi et al. | |
| 2013/0029494 A1 | 1/2013 | Sasaki et al. | |
| 2013/0029496 A1 | 1/2013 | Bauer et al. | |
| 2013/0045605 A1 | 2/2013 | Wang et al. | |
| 2013/0085618 A1 | 4/2013 | Ding | |
| 2013/0104996 A1 | 5/2013 | Oh et al. | |
| 2013/0106286 A1 | 5/2013 | Banna et al. | |
| 2013/0131300 A1 | 5/2013 | Olmscheid et al. | |
| 2013/0145816 A1 | 6/2013 | Lowe | |
| 2013/0157388 A1 | 6/2013 | Grimbergen | |
| 2013/0220433 A1 | 8/2013 | Sawada et al. | |
| 2013/0270997 A1 | 10/2013 | Zhao et al. | |
| 2014/0033828 A1 | 2/2014 | Larson et al. | |
| 2014/0080308 A1 | 3/2014 | Chen et al. | |
| 2014/0120737 A1 | 5/2014 | Swaminathan et al. | |

(56) References Cited

U.S. PATENT DOCUMENTS

| | | | |
|---|---|---|---|
| 2014/0141621 | A1 | 5/2014 | Ren et al. |
| 2014/0144471 | A1 | 5/2014 | Kahlon et al. |
| 2014/0182689 | A1 | 7/2014 | Shareef et al. |
| 2014/0213055 | A1 | 7/2014 | Himori et al. |
| 2014/0248780 | A1 | 9/2014 | Ingle et al. |
| 2014/0262038 | A1 | 9/2014 | Wang et al. |
| 2014/0273460 | A1 | 9/2014 | Reyland et al. |
| 2015/0017810 | A1 | 1/2015 | Guha |
| 2015/0059859 | A1 | 3/2015 | Takahashi et al. |
| 2015/0181684 | A1 | 6/2015 | Banna et al. |
| 2015/0184287 | A1 | 7/2015 | Tsung et al. |
| 2015/0287572 | A1 | 10/2015 | Daugherty et al. |
| 2015/0340209 | A1 | 11/2015 | Koltonski |
| 2015/0371831 | A1 | 12/2015 | Rozenzon et al. |
| 2016/0111258 | A1 | 4/2016 | Taskar et al. |
| 2016/0181116 | A1 | 6/2016 | Berry, III et al. |
| 2016/0211165 | A1* | 7/2016 | McChesney ...... H01L 21/67069 |
| 2016/0211166 | A1 | 7/2016 | Yan et al. |
| 2016/0215392 | A1 | 7/2016 | Yudovsky et al. |
| 2016/0247688 | A1 | 8/2016 | Zhu et al. |
| 2017/0018407 | A1 | 1/2017 | Kondo |
| 2017/0032982 | A1 | 2/2017 | Drewery et al. |
| 2017/0069511 | A1 | 3/2017 | Yang et al. |
| 2017/0110335 | A1 | 4/2017 | Yang et al. |
| 2017/0200586 | A1 | 7/2017 | Treadwell et al. |
| 2017/0236694 | A1 | 8/2017 | Eason et al. |

FOREIGN PATENT DOCUMENTS

| | | |
|---|---|---|
| CN | 103730318 A | 4/2014 |
| CN | 104299929 A | 1/2015 |
| CN | 104752141 A | 7/2015 |
| CN | 104851832 A | 8/2015 |
| CN | 105336561 A | 2/2016 |
| EP | 0424299 A2 | 4/1991 |
| EP | 0838842 A2 | 4/1998 |
| JP | 2001-230239 A | 8/2001 |
| JP | 2015201552 A | 11/2015 |
| KR | 20050008792 A | 1/2005 |
| KR | 20080023569 A | 3/2008 |
| TW | 506234 B | 10/2002 |
| TW | 201207933 A | 2/2012 |
| TW | 201324653 A | 6/2013 |
| TW | 201436089 A | 9/2014 |
| WO | WO-0040776 A1 | 7/2000 |
| WO | WO-2011051251 A1 | 5/2011 |
| WO | WO-2013123617 A1 | 8/2013 |
| WO | WO-2014068886 A1 | 5/2014 |

OTHER PUBLICATIONS

First Office Action dated Dec. 29, 2017 corresponding to Chinese Patent Application No. 201610032252.1, 12 pages.

U.S. Appl. No. 14/945,680, John Drewery.

U.S. Appl. No. 15/013,400, Yang et al.

U.S. Appl. No. 15/014,539, Yang et al.

U.S. Appl. No. 15/399,692, Treadwell et al.

U.S. Appl. No. 15/427,163, filed Feb. 8, 2017, Kwame Eason et al.

U.S. Appl. No. 62/275,837, filed Jan. 7, 2016, Jason Lee Treadwell et al.

First Office Action dated Aug. 2, 2018 corresponding to Chinese Patent Application No. 201710036188.9, 7 pages.

Bohr, Mark, "The New Era of Scaling in an SoC World" Intel Logic Technology Development; ISSCC; 2009; 66 Pages.

Dusa, Mircean et al., "Pitch Doubling Through Dual Patterning Lithography Challenges in Integration and Litho Budgets," Optical Microlithography XX, vol. 6520, 65200G, (2007); 10 pages.

U.S. Office Action dated Oct. 5, 2015 issued in U.S. Appl. No. 14/576,020 [LAMRP146].

Blain et al. (Jul./Aug. 1996) "Role of nitrogen in the downstream etching of silicon nitride," Journal of Vacuum Science & Technology A, 14(4):2151-2157.

Blain (Mar./ Apr. 1999) "Mechanism of nitrogen removal from silicon nitride by nitric oxide," Journal of Vacuum Science & Technology A, 17(2):665-667.

Kastenmeier et al. (Nov./Dec. 1999) "Highly selective etching of silicon nitride over silicon and silicon dioxide," J. Vac. Sci. Techno!. A, American Vacuum Society, I7 (6):3179-3184.

Kastenmeier et al. (Sep./Oct. 1996) "Chemical dry etching of silicon nitride and silicon dioxide using CF4/02/N2 gas mixtures," J. Vac. Sci. Technol. A14(5):2802-2813.

Oehrlein et al. (1996) "Study of plasma-surface interactions: chemical dry etching and high-density plasma etching," Plasma Sources Sci. Technol. 5:193-199.

Tajima et al. (2013) "Room-Temperature Si Etching in NO/F2 Gases and the Investigation of Surface Reaction Mechanisms," The Journal of Physical Chemistry C, 117:5118-5125.

Yun et al. (2007) "Large Etch Rate Enhancement by NO-Induced Surface Chemical Reaction during Chemical Dry Etching of Silicon Oxide in F2 Remote Plasmas," Journal of The Electrochemical Society, 154(4):D267-D272.

U.S. Final Ofice Action dated Feb. 26, 2016 issued in U.S. Appl. No. 14/576,020 [LAMRP146].

U.S. Office Action dated Sep. 23, 2016 issued in U.S. Appl. No. 14/576,020 [LAMRP146].

European Extended Search Report dated May 30, 2016 issued in EP 15 199 363.1 [LAMRP146EP].

U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).

U.S. Appl. No. 62/065,497, entitled "Gas Supply Delivery Arrangement Including a Gas Splitter for Tunable Gas Flow Control," filed Oct. 17, 2014, in the names of Mark Taskar et al. (Year: 2014).

\* cited by examiner

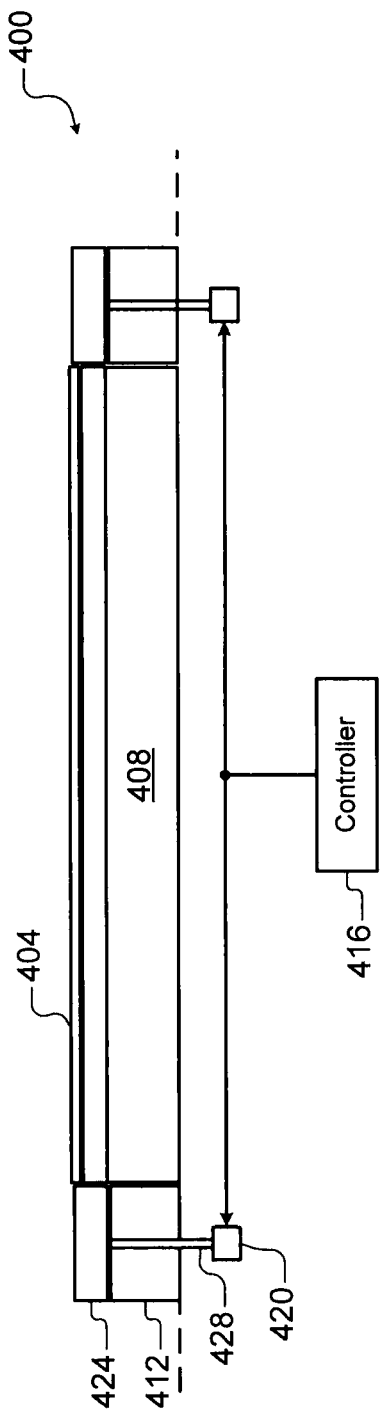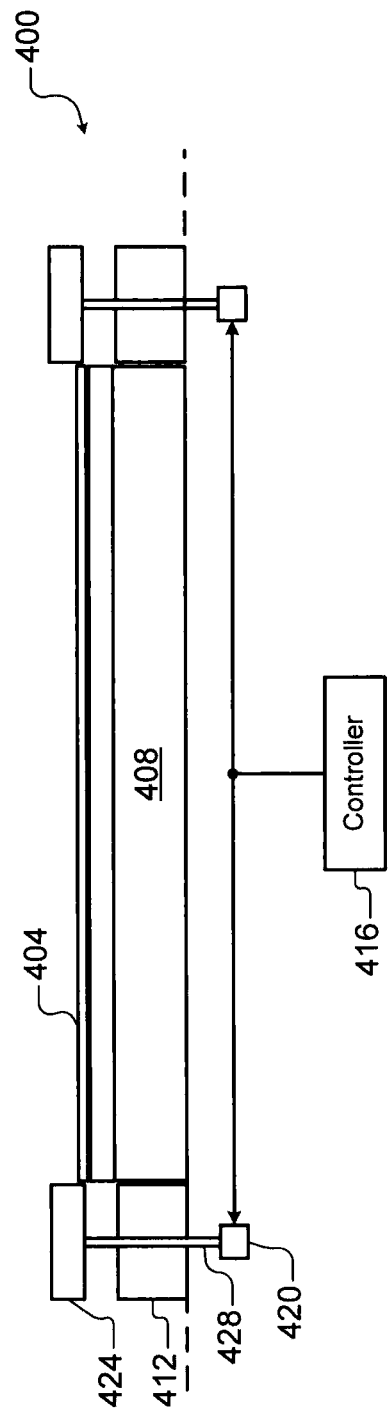

CONTROL OF ON-WAFER CD UNIFORMITY WITH MOVABLE EDGE RING AND GAS INJECTION ADJUSTMENT

FIELD

The present disclosure relates to substrate processing, and more particularly to systems and methods for controlling etch uniformity in substrate processing.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc.

SUMMARY

A substrate support in a substrate processing system includes an inner portion and an outer portion. The inner portion is positioned below a gas distribution device configured to direct first process gases toward the inner portion. The outer portion includes an edge ring positioned around an outer perimeter of the inner portion to at least partially surround the inner portion and a substrate arranged on the inner portion. The edge ring is configured to be raised and lowered relative to the inner portion, and to direct second process gases toward the inner portion. A controller determines distribution of material deposited on the substrate during processing and, based on the determined distribution, selectively adjusts a position of the edge ring and selectively adjusts flow of at least one of the first process gases and the second process gases.

A method for processing a substrate in a substrate processing system includes providing a substrate support having an inner portion and an outer portion. The inner portion positioned below a gas distribution device, and the outer portion includes an edge ring positioned around an outer perimeter of the inner portion to at least partially surround the inner portion and a substrate arranged on the inner portion. The method further includes directing first process gases toward the inner portion using the gas distribution device, directing second process gases toward the inner portion using the edge ring, determining distribution of material deposited on the substrate during processing, selectively adjusting a position of the edge ring upward or downward relative to the inner portion, and selectively adjusting flow of at least one of the first process gases and the second process gases.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4A shows an example variable depth edge ring in a lowered position according to the present disclosure;

FIG. 4B shows an example variable depth edge ring in a raised position according to the present disclosure;

In the drawings, reference numbers may be reused to identify similar and/or identical elements.

DETAILED DESCRIPTION

Figure 1:
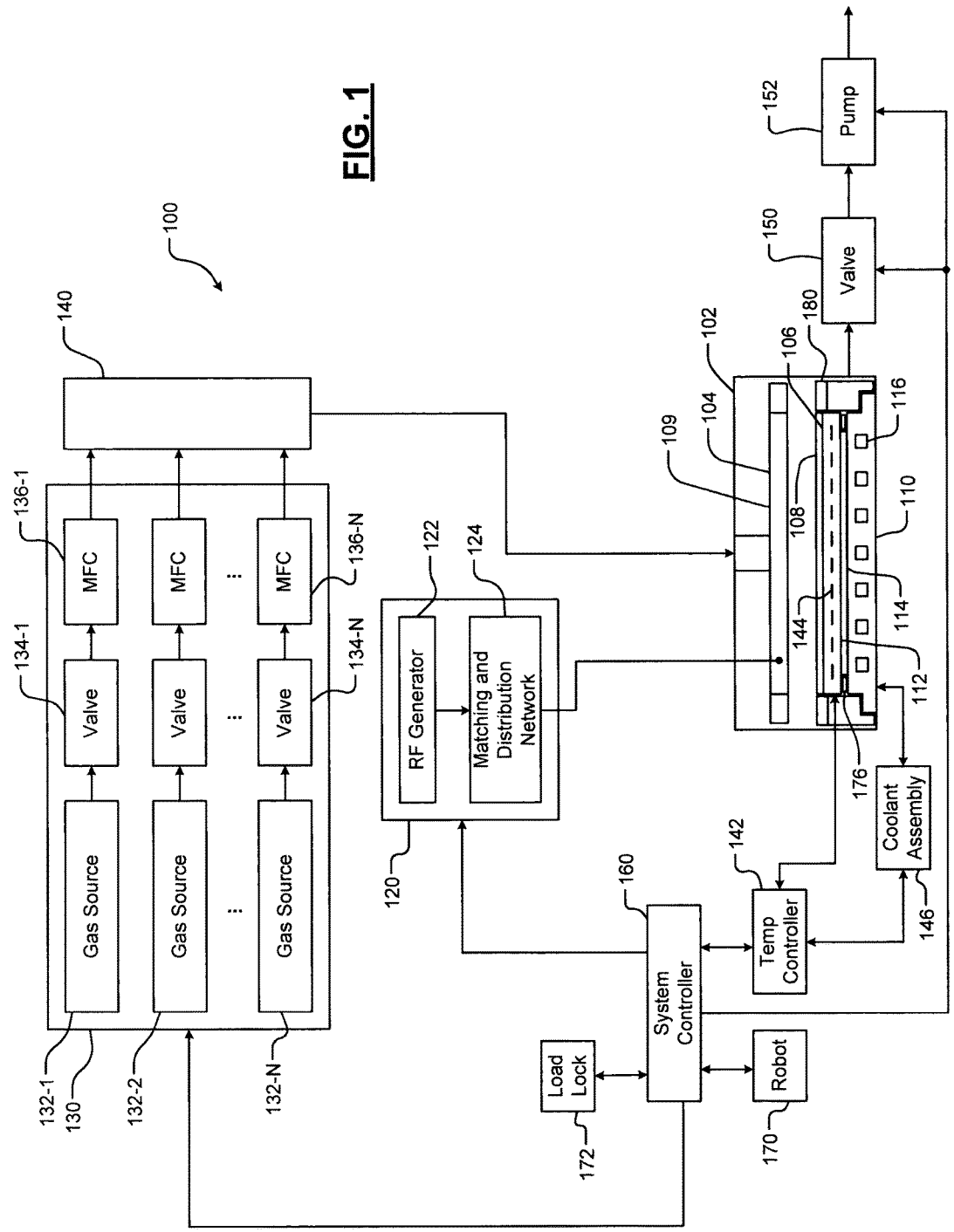
FIG. 1 is a functional block diagram of an example processing chamber according to the present disclosure.

A substrate support in a substrate processing system may include an edge ring. An upper surface of the edge ring may extend above an upper surface of the substrate support, causing the upper surface of the substrate support (and, in some examples, an upper surface of a substrate arranged on the substrate support) to be recessed relative to the edge ring. This recess may be referred to as a pocket. A distance between the upper surface of the edge ring and the upper surface of the substrate may be referred to as a "pocket depth." Generally, the pocket depth is fixed according to a height of the edge ring relative to the upper surface of the substrate. If a different pocket depth is required, the edge ring must be manually replaced, which may be limited by wafer handling constraints, process constraints, chamber constraints, etc.

Some aspects of etch processing may vary due to characteristics of the substrate processing system, the substrate, gas mixtures, etc. For example, flow patterns, and therefore an etch rate and etch uniformity, may vary according to the pocket depth of the edge ring, edge ring geometry (i.e., shape), etc. In some example processes, overall etch rates vary as the distance between the upper surface of the substrate and the bottom surface of the gas distribution device increases. Further, the etch rates may vary from the center of the substrate to an outer perimeter of the substrate. For example, at an outer perimeter of the substrate, sheath bending and ion tilt can cause shallow trench isolation (STI) tilt, and chemical loading associated with reactive species (e.g., etchants and/or deposition precursors) can cause hard mask critical dimension roll off. Further, material such as etch by-products can be re-deposited on the substrate. Etch rates may vary according to other process parameters including, but not limited to, gas velocities across the upper surface of the substrate. For example, parameters associated with the injection of various process gases (e.g., including injection from center nozzles, side tuning nozzles, etc.) that may affect process results include, but are not limited to, gas flow rates, gas species, injection angle, injection position, etc.

Accordingly, varying the configuration of the edge ring (e.g., including edge ring height and/or geometry) may modify the gas velocity profile across the surface of the substrate. Similarly, adjusting parameters associated with the injection of various process gases may also affect process results. For example only, gas injection parameters may include, but are not limited to, gas flow, gas species, injection angle, injection position, etc. Variable depth edge ring systems and methods according to the principles of the present disclosure combine adjusting the edge ring height and adjusting the parameters of process gas injection during substrate processing to control etch uniformity. In this manner, gas flow recirculation and the associated by-product deposition can be modulated.

For example, the edge ring may be coupled to an actuator configured to raise and lower the edge ring in response to a controller, user interface, etc. In one example, a controller of the substrate processing system controls the height of the edge ring during a process, between process steps, etc. according to a particular recipe being performed and associated gas injection parameters. The controller may be configured to adjust gas injection parameters accordingly. For example only, the controller may store data (e.g., a lookup table) that indexes edge ring height, etc. to one or more parameters associated with process gas injection. The data may further associate the edge ring height and gas injection parameters with etch by-product distribution across the substrate. The data may correspond to predetermined (e.g., calibrated or programmed) data, data provided by a user via an interface, etc. In this manner, a desired etch uniformity can be achieved by dynamically adjusting the edge ring height and gas injection parameters during processing according to the etch by-product distribution. In some examples, the edge ring may include gas injection nozzles for injecting additional side tuning gases.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes an edge ring 180. The edge ring 180 according to the principles of the present disclosure is moveable (e.g., moveable upward and downward in a vertical direction) relative to the substrate 108. For example, the edge ring 180 may be controlled via an actuator responsive to the controller 160 as described below in more detail. The edge ring 180 may be adjusted during substrate processing in accordance with gas injection parameters. In some examples, the edge ring 180 may include gas injection nozzles for injecting additional side tuning gases.

Figure 2A:
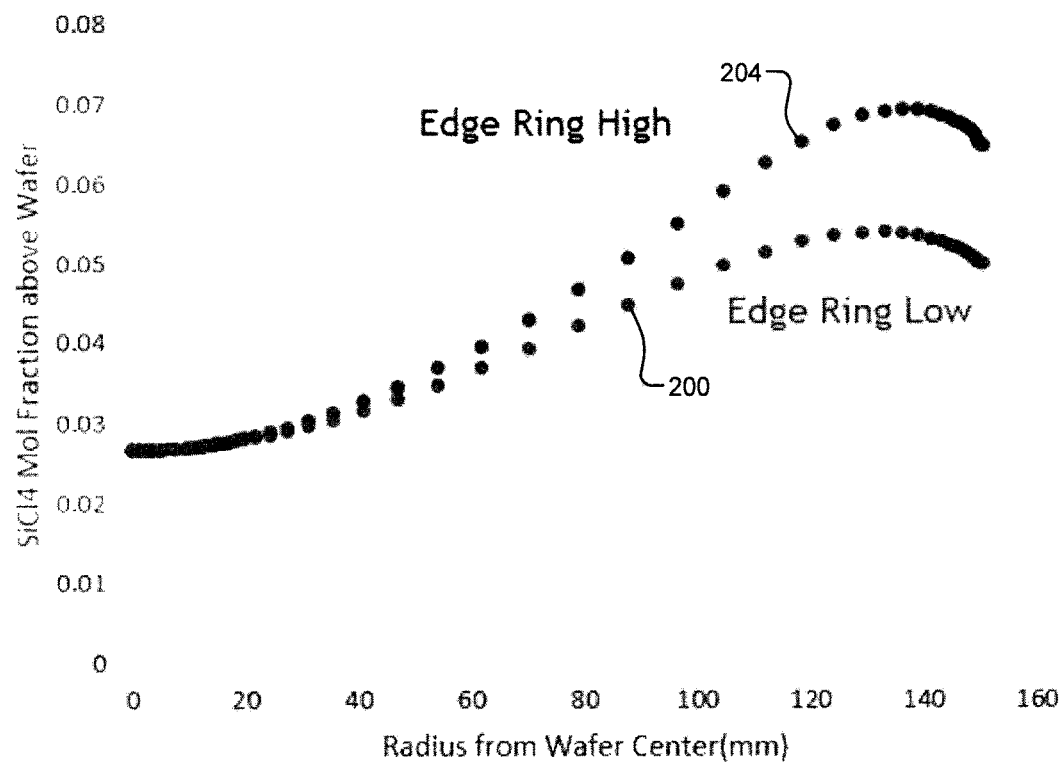
FIG. 2A shows example by-product distributions across a substrate for center-injected process gases according to the present disclosure.
Figure 2B:
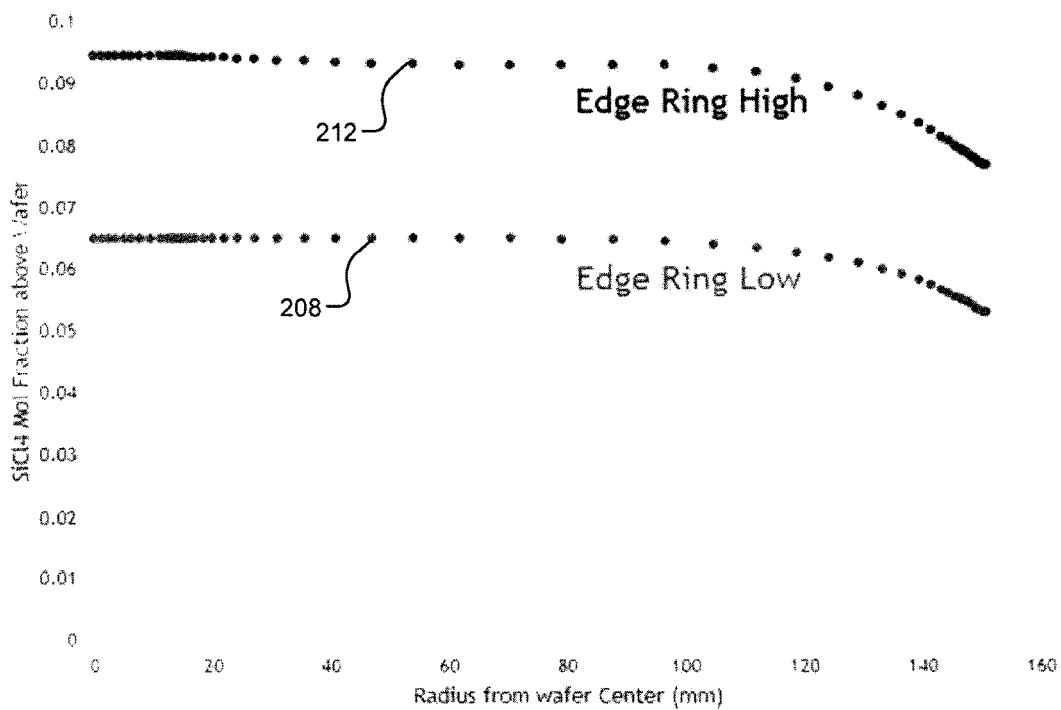
FIG. 2B shows example by-product distributions across a substrate for side-injected process gases according to the present disclosure.

Referring now to FIGS. 2A and 2B, by-product distributions across a substrate for a raised (high) edge ring position and a lowered (low) edge ring position are shown. FIG. 2A shows by-product distributions for center-injected process gases (i.e., gases injected from a center or inner portion of a showerhead. A by-product distribution 200 illustrates by-product distribution (e.g., as measured in a mol fraction of SiCL4 above a corresponding position of the substrate/wafer, measured in a radius of 0 to 160 mm from a center of the substrate) with the edge ring in a lowered position. Conversely, a by-product distribution 204 illustrates by-product distribution with the edge ring in a raised position. As shown, for center-injected process gases, a greater amount of by-product is deposited near an edge region of the substrate relative to a center region of the substrate for both lowered and raised edge ring positions, but lowering the edge ring results in relatively less by-product distribution near the edge region.

FIG. 2B shows by-product distributions for side-injected process gases (i.e., gases injected from an outer, side tuning portion of a showerhead and/or, in some examples, gases injected from edge ring nozzles as described below in more detail). A by-product distribution 208 illustrates by-product distribution with the edge ring in a lowered position. Conversely, a by-product distribution 212 illustrates by-product distribution with the edge ring in a raised position. As shown, for side-injected process gases, a greater amount of by-product is deposited near a center region of the substrate relative to an edge region of the substrate for both lowered and raised edge ring positions, but lowering the edge ring results in relatively less by-product distribution near the edge region.

Figure 3:
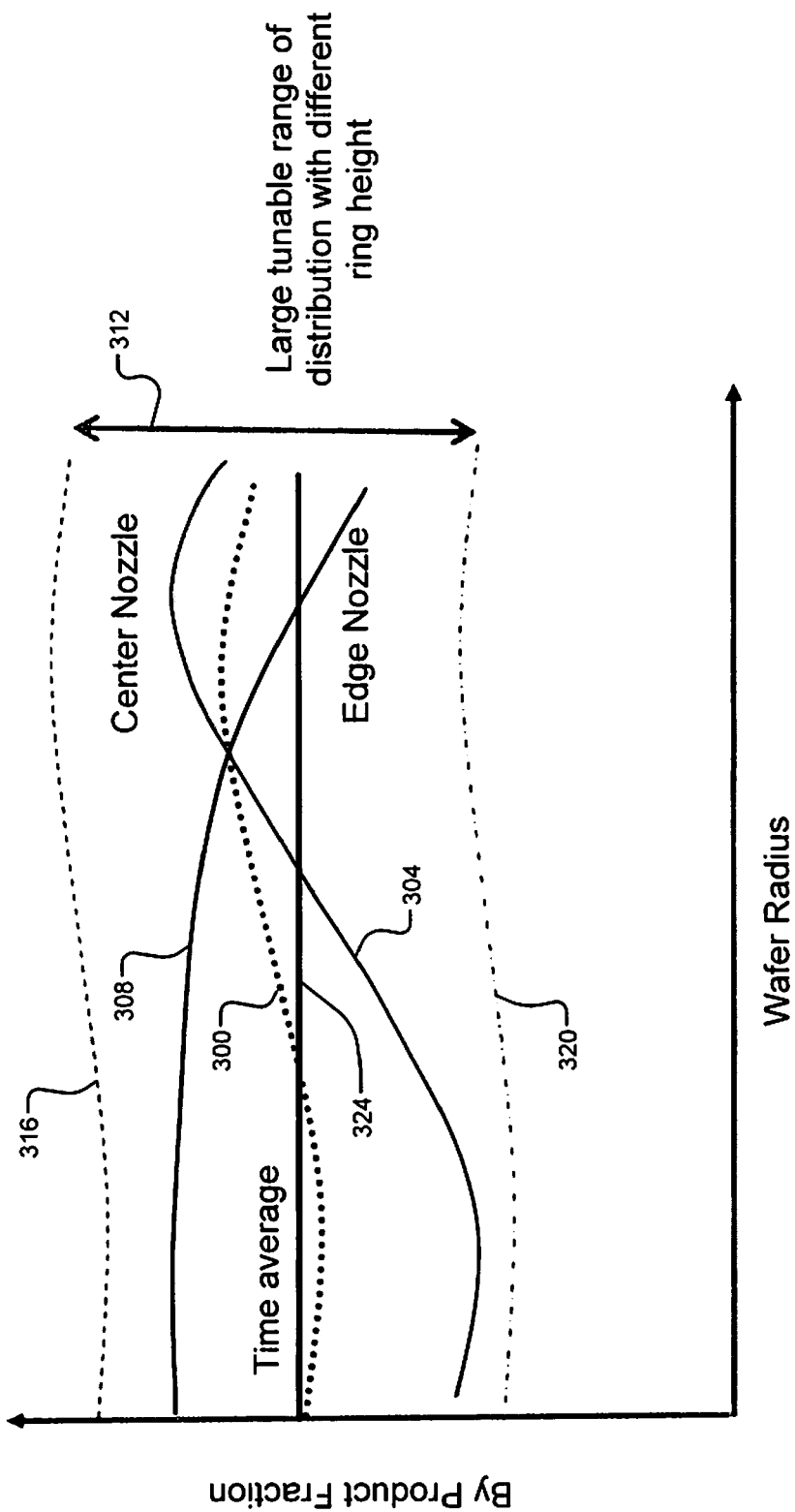
FIG. 3 shows an example control range and average profile of the by-product distribution of center-injected process gases and side-injected process gases according to the present disclosure.

FIG. 3 shows an example average by-product distribution 300 of by-product distributions 304 and 308 associated with center-injected gases and side-injected process gases, respectively, across a radius of a substrate. The average by-product distribution 300 may correspond to an average by-product distribution over a predetermined period (e.g., over a predetermined period corresponding to a given processing step) for a predetermined position of the edge ring. The by-product distributions 304 and 308 may also be associated with respective predetermined gas flow rates, gas species, etc. corresponding to the center-injected gases and the side-injected gases.

A region 312 between an upper bound 316 and a lower bound 320 may therefore correspond to a tunable range of by-product distribution achievable by adjusting a position of (i.e., raising and lowering) the edge ring. For example, the upper bound 316 may correspond to an example maximum amount of by-product distribution achievable and the lower bound 320 may correspond to an example minimum amount of by-product distribution achievable. The by-product distribution may be further adjusted by selectively adjusting center-injected gas flow and side-injected gas flow. The edge ring height and gas flow can be dynamically adjusted during processing to achieve a desired by-product distribution 324 for a predetermined period.

For example, the system controller 160 may store data, such as a model, that associates an average by-product distribution for each region of a substrate with various parameters including, but not limited to, edge ring position, side-injected gas flow, center-injected gas flow, gas species, edge ring shape, etc. The data may include data indicative of the by-product distributions 304 and 308 for a plurality of different edge ring positions, process gas injection flow rates, gas species, etc. For example only, the data, including the average by-product distributions, may be determined based on estimates, models, post-processing analyses of previous substrates, etc. Accordingly, for a given set of parameters that are not adjustable during processing (e.g., edge ring shape, desired by-product distribution, etc.), the controller 160 is configured to calculate associated parameters that can be adjusted during processing to achieve the desired by-product distribution (e.g., edge ring height and respective amounts of center-injected and side-injected gas flow). In some examples, the controller 160 may dynamically calculate the by-product distribution during processing and make adjustments accordingly. For example, as shown in FIG. 2A, for a given edge ring height, center-injected gases cause greater by-product distribution at edges of the substrate while side-injected gases cause less by-product distribution at edges of the substrate.

Accordingly, processing may begin with the edge ring in a first position and with respective center-injected and side-injected gas flow rates, resulting in relatively greater by-product distribution in the edge region of the substrate and relatively less by-product distribution in the center region of the substrate. The system controller 160 may then cause the edge ring to be lowered (or raised) to a second position while also adjusting respective flow rates of the center-injected and side-injected gases. For example, the edge ring may be lowered while decreasing (or completely shutting off) the flow rate of the center-injected gas and increasing the flow rate of the side-injected gas, resulting in relatively less by-product distribution in the edge region of the substrate and relatively greater by-product distribution in the center region of the substrate. Adjusting the respective flow rates may include completely turning off the center-injected or side-injected gas flow, beginning processing with the center-injected or side-injected gas flow turned off and subsequently turning on the center-injected or side-injected gas flow, etc.

In some examples, the controller 160 may be configured to perform a sequence of predetermined adjustments for a particular process. For example, in a first predetermined period, the controller 160 may adjust the edge ring to a first height while selecting first respective center-injected and side-injected gas flow rates. In a second predetermined period, the controller 160 may adjust the edge ring to a second height while selecting second respective center-injected and side-injected gas flow rates. In this manner, a process or processing step may be segmented into two or more predetermined periods having respective edge ring positions and gas flow rates.

Referring now to FIGS. 4A, 4B, and 4C, a substrate support 400 having a substrate 404 arranged thereon according to the principles of the present disclosure is shown. The substrate support 400 may include a base or pedestal having an inner portion (e.g., corresponding to an ESC) 408 and an outer portion 412. In examples, the outer portion 412 may be independent from, and moveable in relation to, the inner portion 408. The substrate 404 is arranged on the inner portion 408 for processing. A controller 416 communicates with one or more actuators 420 to selectively raise and lower edge rings 424 to adjust a pocket depth of the support 400. For example only, the edge ring 424 is shown in a fully lowered position in FIG. 4A and in an example fully raised position in FIG. 4B. As shown, the actuators 420 correspond to pin actuators configured to selectively extend and retract pins 428 in a vertical direction. Other suitable types of actuators may be used in other examples. For example only, the edge ring 424 corresponds to a ceramic or quartz edge ring. In FIG. 4A, the controller 416 communicates with the actuators 420 to directly raise and lower the edge ring 424 via the pins 428. In some examples, the inner portion 408 is moveable relative to the edge ring 424.

Figure 5A:
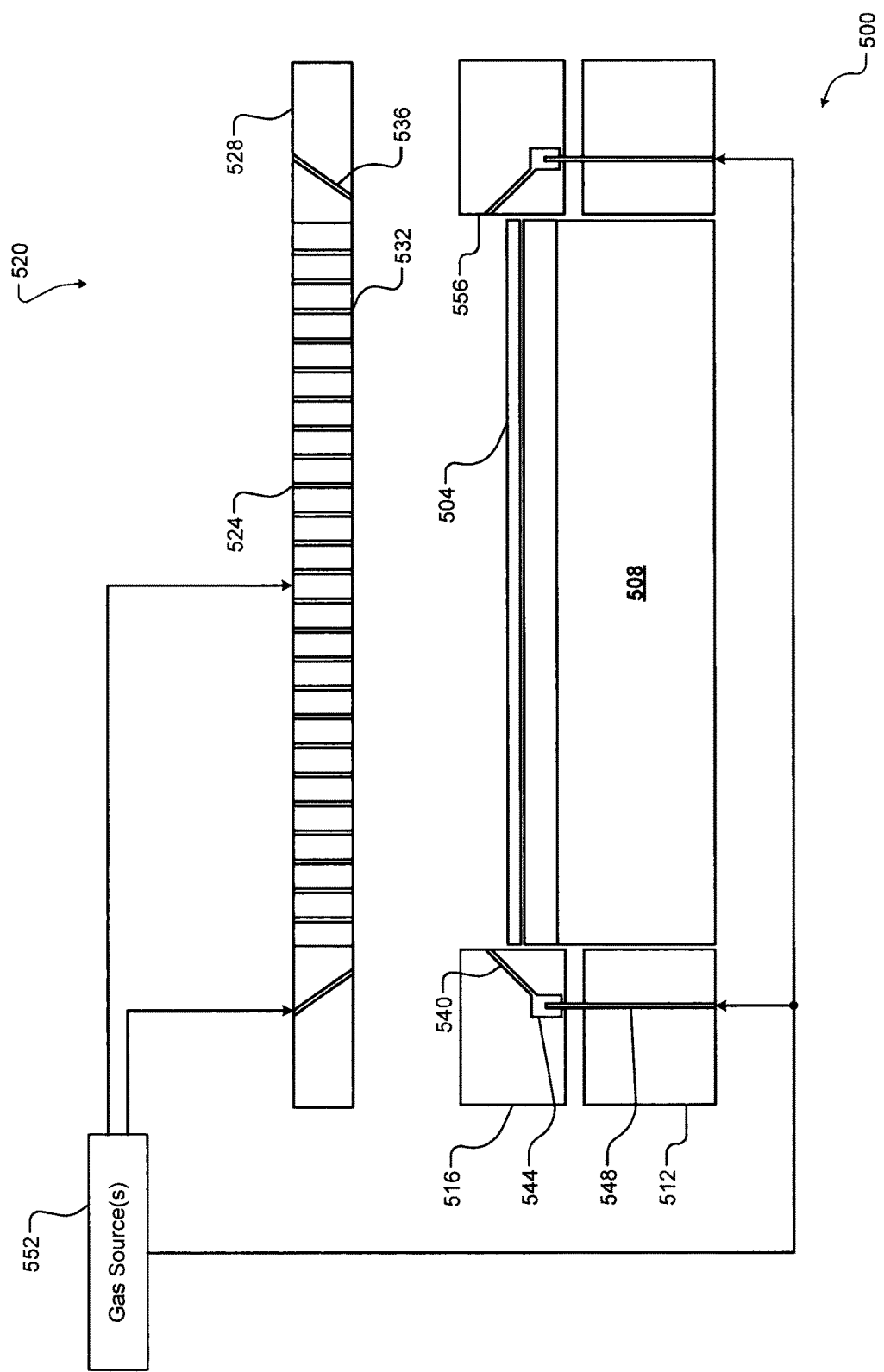
FIGS. 5A and 5B show an example edge ring including edge ring gas injection nozzles according to the present disclosure.
Figure 5B:
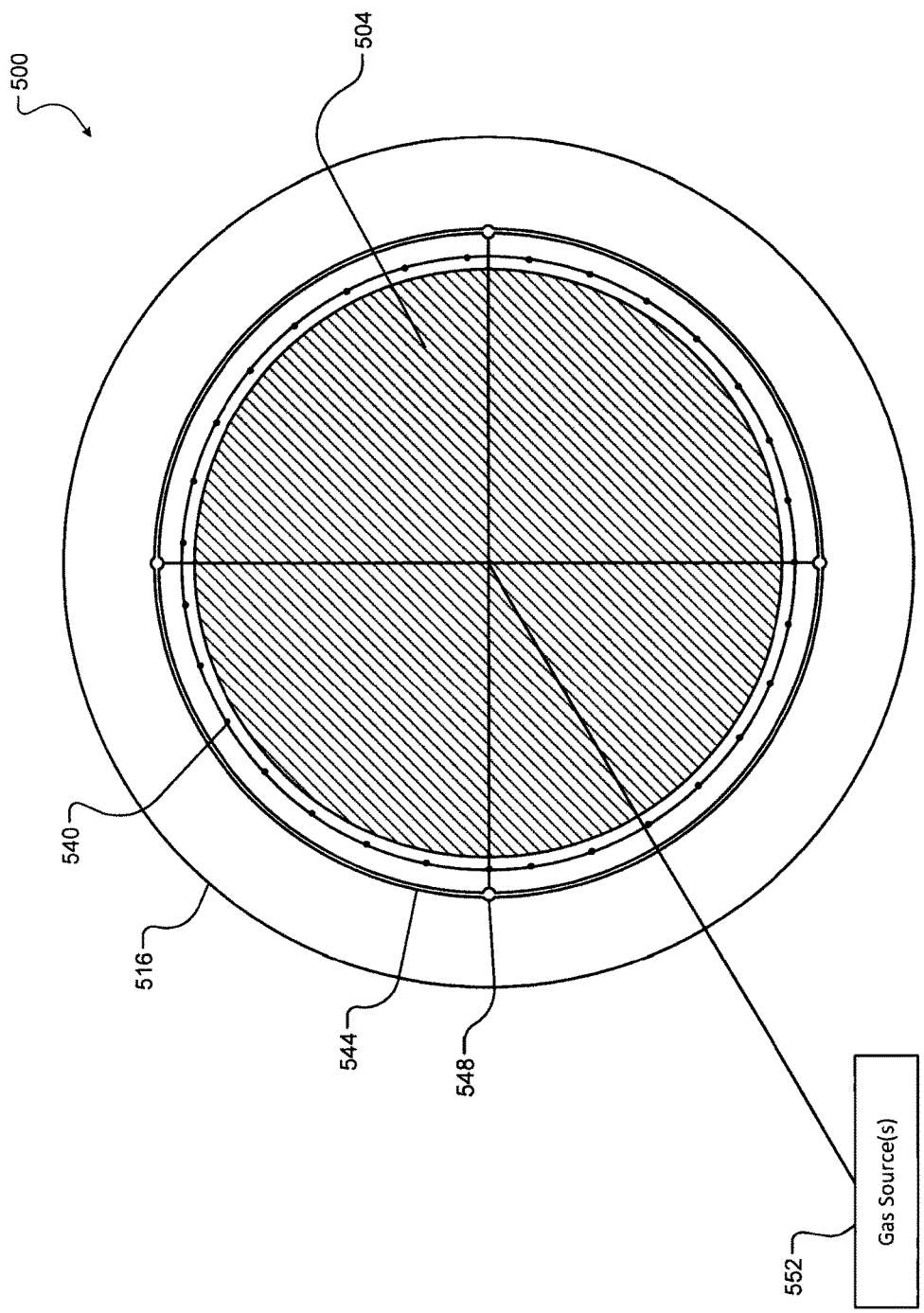

Referring now to FIGS. 5A and 5B, an example substrate support 500 having a substrate 504 arranged thereon is shown. The substrate support 500 includes a base or pedestal having an inner portion 508 and an outer portion 512. The outer portion includes an edge ring 516 that is selectively moveable (i.e., raised and lowered) as described above with respect to FIGS. 1-4. However, portions of the substrate support 500 related to controlling movement of the edge ring 516 are omitted from FIG. 5 for simplicity.

The substrate support 500 is positioned below a gas distribution device such as a showerhead 520. The showerhead 520 includes a center portion 524 and may optionally include an outer portion 528. The center portion 524 includes center gas nozzles 532 arranged to direct process gases downward directly above the substrate 504. The outer portion 520 may include side-tuning gas nozzles 536 arranged to direct process gases toward outer edges of the substrate 504.

In some examples, the edge ring 516 includes edge ring nozzles 540. The edge ring nozzles 540 may be provided instead of or in addition to side-tuning gas nozzles 536 in the outer portion 528 of the showerhead 520. The edge ring nozzles 540 are arranged to provide additional side-tuning gases to further control by-product distribution as described above in FIGS. 1-3. For example, the edge ring 516 may define a plenum 544 arranged to receive, via one or more conduits 548, gases from gas source(s) 552. For example, the gas source(s) 552 provide process gases in accordance with control signals generated by a controller (e.g., the system controller 160 of FIG. 1) as described above.

Characteristics of the edge ring nozzles 540 may differ for different processes, processing chambers, etc. Example characteristics of the edge ring nozzles 540 that may be modified include, but are not limited to, quantity, size, shape, and injection angle. Accordingly, in addition to adjusting edge ring position, gas flow, etc., by-product distribution can be further controlled by selecting an edge ring with edge ring nozzles 540 having desired characteristics. In some examples, a shape of the edge ring 516 may vary to further control by-product distribution. For example, although shown with a rectangular inner diameter 556, the inner diameter 556 may be beveled, curved, etc. in other examples.

Figure 6:
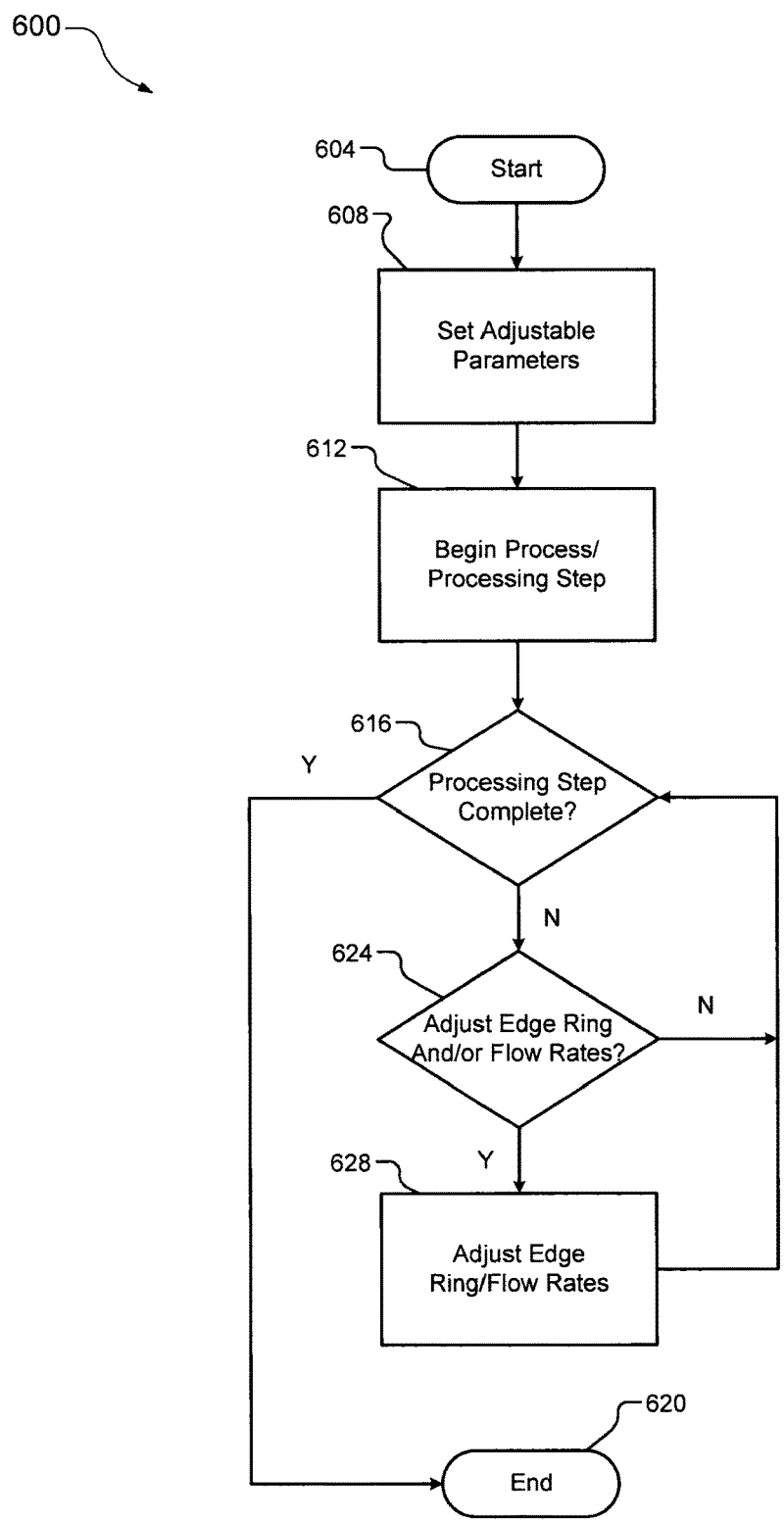
FIG. 6 shows steps of an example method for controlling by-product distribution across a substrate according to the present disclosure.

Referring now to FIG. 6, an example method 600 for controlling by-product distribution across a substrate begins at 604. At 608, the method 600 (e.g., the system controller 160) sets adjustable parameters of a process chamber based on a selected process, processing step, etc. For example, the method 600 may set the adjustable parameters according to stored data associating characteristics of a selected process (e.g., process type, gas species, edge ring characteristics, etc.) with various adjustable parameters. The parameters include, but are not limited to, edge ring position and respective gas flow rates for center-injected process gases and side-injected process gases (e.g., injected from a side-tuning portion of a showerhead and/or from edge ring nozzles of an edge ring).

At 612, the method 600 begins a process or processing step. At 616, the method 600 determines whether the processing step is complete. If true, the method 600 ends at 620. If false, the method 600 continues to 624. At 624, the method 600 determines whether to adjust parameters related to control of by-product distribution as described above with respect to FIGS. 1-5. For example, the method 600 may adjust edge ring position and/or process gas flow rates after a predetermined period, based on a calculation or estimate of by-product distribution during the process, etc. If true, the method 600 continues to 628. If false, the method 600 continues to 616.

At 628, the method 600 (e.g., the system controller 160) adjusts the edge ring position and/or gas flow rates. In some examples, the method 600 adjusts the edge ring position and the gas flow rates to predetermined values (e.g., based on a time elapsed since the process/processing step began). In other examples, the method 600 may calculate or estimate (e.g., based on current and previous edge ring positions, gas flow rates, etc.) by-product distribution in various regions of the substrate and adjust the edge ring position and/or gas flow rates accordingly. The method 600 then continues to 616.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:
1. A substrate processing system, comprising:
   a substrate support including
      an inner portion positioned below a gas distribution device configured to direct first process gases toward the inner portion, and
      an outer portion including an edge ring, wherein the edge ring is positioned around an outer perimeter of the inner portion to at least partially surround the inner portion and a substrate arranged on the inner portion, wherein the edge ring is configured to be raised and lowered relative to the inner portion, and wherein the edge ring is configured to direct second process gases toward the inner portion; and
   a controller configured to, during processing of the substrate,
      calculate a distribution of etch by-product material redeposited onto the substrate based on data that associates the distribution of etch by-product material redeposited onto the substrate with at least one of edge ring position, the first process gases directed by the gas distribution device, and the second process gases directed by the edge ring, and
      in response to the calculated distribution, (i) selectively adjust a position of the edge ring and (ii) selectively adjust flow of at least one of the first process gases and the second process gases.

2. The substrate processing system of claim 1, wherein the data includes an average of (i) etch by-product material deposited on the substrate caused by the first process gases and (ii) etch by-product material deposited on the substrate caused by the second process gases.

3. The substrate processing system of claim 1, wherein the controller, based on the data, (i) adjusts the position of the edge ring to a first position, adjusts flow of the first process gases to a first flow rate, and adjusts flow of the second process gases to a second flow rate for a first predetermined period, and (ii) subsequent to the first predetermined period, adjusts the position of the edge ring to a second position, adjusts the flow of the first process gases to a third flow rate, and adjusts the flow of the second process gases to a fourth flow rate for a second predetermined period.

4. The substrate processing system of claim 3, wherein adjusting the flow to at least one of the first flow rate, the second flow rate, the third flow rate, and the fourth flow rate includes turning off a corresponding one of the first process gases and the second process gases.

5. The substrate processing system of claim 1, wherein the edge ring includes a plurality of gas injection nozzles.

6. The substrate processing system of claim 5, wherein the plurality of gas injection nozzles are in fluid communication with a source of the second process gases via a plenum defined with the edge ring and at least one conduit coupled to the source.

7. A method for processing a substrate in a substrate processing system, the method comprising:
providing a substrate support having an inner portion and an outer portion, wherein the inner portion positioned below a gas distribution device, and wherein the outer portion includes an edge ring positioned around an outer perimeter of the inner portion to at least partially surround the inner portion and a substrate arranged on the inner portion;
directing first process gases toward the inner portion using the gas distribution device;
directing second process gases toward the inner portion using the edge ring; and
during processing of the substrate,
calculating a distribution of etch by-product material redeposited onto the substrate based on data that associates the distribution of etch by-product material redeposited onto the substrate with at least one of edge ring position, the first process gases directed by the gas distribution device, and the second process gases directed by the edge ring, and
in response to the calculated distribution, selectively adjusting a position of the edge ring upward or downward relative to the inner portion and selectively adjusting flow of at least one of the first process gases and the second process gases.

8. The method of claim 7, wherein the data includes an average of (i) etch by-product material deposited on the substrate caused by the first process gases and (ii) etch by-product material deposited on the substrate caused by the second process gases.

9. The method of claim 7, further comprising, based on the data, (i) adjusting the position of the edge ring to a first position, adjusting flow of the first process gases to a first flow rate, and adjusting flow of the second process gases to a second flow rate for a first predetermined period, and (ii) subsequent to the first predetermined period, adjusting the position of the edge ring to a second position, adjusting the flow of the first process gases to a third flow rate, and adjusting the flow of the second process gases to a fourth flow rate for a second predetermined period.

10. The method of claim 9, wherein adjusting the flow to at least one of the first flow rate, the second flow rate, the third flow rate, and the fourth flow rate includes turning off a corresponding one of the first process gases and the second process gases.

11. The method of claim 7, wherein the edge ring includes a plurality of gas injection nozzles.

12. The method of claim 11, wherein the plurality of gas injection nozzles are in fluid communication with a source of the second process gases via a plenum defined with the edge ring and at least one conduit coupled to the source.

* * * * *